United States Patent
Blanchard et al.

(10) Patent No.: US 10,955,475 B2
(45) Date of Patent: Mar. 23, 2021

(54) DEVICE AND METHOD FOR TESTING THE OPERATION OF A PROTECTION UNIT AND PROTECTION UNIT COMPRISING SUCH A TEST DEVICE

(71) Applicant: Schneider Electric Industries SAS, Rueil Malmaison (FR)

(72) Inventors: Pierre Blanchard, Voreppe (FR); Jiri Stepanek, Echirolles (FR); Bruno Bordet, Saint Martin le Vinoux (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 15/973,762

(22) Filed: May 8, 2018

(65) Prior Publication Data

US 2018/0372800 A1 Dec. 27, 2018

(30) Foreign Application Priority Data

Jun. 22, 2017 (FR) ...................... 17 55699

(51) Int. Cl.
*G01R 31/28* (2006.01)
*G01R 31/327* (2006.01)
*H02H 1/00* (2006.01)
*H02H 3/05* (2006.01)
*H02H 3/08* (2006.01)

(52) U.S. Cl.
CPC ....... *G01R 31/327* (2013.01); *G01R 31/3277* (2013.01); *H02H 1/0007* (2013.01); *H02H 1/0038* (2013.01); *H02H 3/05* (2013.01); *H02H 3/08* (2013.01)

(58) Field of Classification Search
CPC .......... B60L 2240/549; B60L 2250/10; B60L 3/0069; B60L 3/04; G01R 15/185; G01R 19/30
See application file for complete search history.

(56) References Cited

U.S. PATENT DOCUMENTS

| 2008/0144239 | A1 | 6/2008 | Chelloug | |
| 2011/0273139 | A1* | 11/2011 | Hofheinz | B60L 3/0023 320/109 |
| 2015/0355273 | A1* | 12/2015 | Adlhoch, Jr. | G01R 31/3277 324/750.3 |

FOREIGN PATENT DOCUMENTS

| DE | 10 2007 007 263 A1 | 8/2007 |
| EP | 1 533 880 A1 | 5/2005 |
| FR | 2 910 189 A1 | 6/2008 |

OTHER PUBLICATIONS

French Preliminary Search Report dated Feb. 9, 2018 in French Application 17 55699, filed on Jun. 22, 2017 (with English Translation of Categories of cited documents & Written Opinion).

* cited by examiner

*Primary Examiner* — Alesa Allgood
(74) *Attorney, Agent, or Firm* — Oblon, McClelland, Maier & Neustadt, L.L.P.

(57) ABSTRACT

A device for testing the operation of a protection unit of an electrical network. The test device includes a generator for generating a pulse train in a secondary winding of a current transformer according to a profile of frequencies such that a measurement of the pulse train after passage through a low-pass filter is lower than a selected trip threshold, and a processing circuit arranged to identify a presence of the pulse train in a signal delivered by a second secondary winding of the current transformer. A protection unit including such a test device and to a method for testing an electrical protection unit.

13 Claims, 6 Drawing Sheets

DEVICE AND METHOD FOR TESTING THE OPERATION OF A PROTECTION UNIT AND PROTECTION UNIT COMPRISING SUCH A TEST DEVICE

TECHNICAL FIELD

The present invention relates to a test device for testing the operation of a protection unit for protecting an electrical network, such as an interrupter, a relay or a differential circuit breaker. The invention also relates to a protection unit for protecting an electrical network including such a test device. The invention also relates to a method for testing a protection unit.

PRIOR ART

Electrical protection units find wide use in electrical installations for protecting goods and persons from electrical faults. One function, among others, of these protection units is to interrupt the supply of electrical power to a faulty portion of an electrical circuit as soon as a fault is detected so as to isolate the faulty portion from the rest of the electrical circuit. The detected fault may be a short circuit, an overload, a ground insulation fault or a differential fault. These protection units generally possess a test means for checking that they are operating correctly. Very often, the opening of the electrical circuit is the outcome of a positive test result. However, it is not always desirable to interrupt the supply of power to the electrical loads present on the electrical circuit portion downstream of the protection unit, these loads potentially being, for example, safety members or machines requiring configuration upon startup. One difficulty therefore consists in testing the protection unit without disrupting its operation and without causing any interruption in the supply of electrical power to the supplied loads.

Document WO 2009/120323 A1 is known, which describes a test device simulating a ground insulation fault. The trip output is inhibited during the test so as not to open the electrical circuit. One drawback of such a device is that the monitoring of the electrical circuit is deactivated for the duration of the test. Moreover, the test is performed periodically which makes the protection periodically inoperative.

Document US 2010 073002 A1 describes a permanent test device for a ground fault protection unit. In this device, a differential current is continuously generated and detected by a measurement circuit. This solution is suitable for a unit having a low operating threshold, for example 30 mA, for protecting persons, but becomes difficult to implement if the protection device has a high trip threshold, for example 5 A. Specifically, the test current itself also becomes high and causes the unit to heat up. A test device is known from publication EP 1 936 771 A1, this device being pulsed and changing trip threshold and delay to minimize energy expenditure. Such a test device therefore does not perform the test for all of the trip thresholds proposed by the unit.

The present invention therefore aims to overcome these drawbacks by making it possible to test whether a protection unit is operating correctly regardless of the selected trip threshold, without causing the electrical circuit to open and without interrupting the protection function.

DISCLOSURE OF THE INVENTION

To achieve this, the invention describes a device for testing the operation of a protection unit of an electrical network, said protection unit including:

- a current transformer composed of a magnetic circuit positioned around at least one current conductor through which a primary current flows forming a primary circuit, said transformer comprising a first secondary winding wound around the magnetic circuit;
- a measurement circuit, connected to the first secondary winding, including a low-pass filter, and arranged to filter and to deliver, after filtering, a signal that is representative of the primary current and to deliver a measurement of the primary current; and
- a trip circuit, linked to the measurement circuit, including means for selecting a trip threshold, the test device including:
- a second secondary winding wound around the magnetic circuit;
- a generator, linked to the trip circuit so as to acquire the selected trip threshold, arranged to generate a pulse train in the second secondary winding according to a profile of frequencies such that the measurement of the pulse train after passage through the low-pass filter is lower than the selected trip threshold; and
- a processing circuit, connected to the measurement circuit and to the generator, arranged to identify a presence of the pulse train in the signal that is representative of the primary current.

Advantageously, the pulse train is composed of pulses having a specific frequency for each selected trip threshold.

Preferably, the frequency of the pulses corresponding to a given trip threshold is higher than the frequency of the pulses corresponding to a higher trip threshold.

In one preferred embodiment, the frequency of the pulses is higher than 300 Hz for a trip threshold that is equal to 30 mA and the frequency of the pulses is lower than 100 Hz for a trip threshold that is higher than 1 A.

In one particular embodiment, the pulse train includes a series of pulses, the frequency and the duty cycle of which form a pattern that can be identified by the processing circuit.

Advantageously, the pattern that can be identified by the processing circuit is specific for each selected trip threshold.

According to one mode of development of the invention, the pulses include a DC component.

Advantageously, the processing circuit includes a module for identifying the presence of the DC component in the signal that is representative of the primary current.

Advantageously, the pulse train generated in the second secondary winding consists of constant-amplitude pulses.

Preferably, the processing circuit transmits an alert signal in the absence of identification of the pulse train in the signal that is representative of the primary current when the generator generates a pulse train in the second secondary winding.

The invention also pertains to a protection unit of an electrical network including:

- a current transformer composed of a magnetic circuit positioned around at least one current conductor through which a primary current flows forming a primary circuit, said current transformer comprising a first secondary winding wound around the magnetic circuit;
- a measurement circuit, connected to the first secondary winding, including a low-pass filter, and arranged to filter and to deliver, after filtering, a signal that is representative of the primary current and to deliver a measurement of the primary current;

a current switch for establishing or for interrupting the flow of an electric current in the, at least one, current conductor;

an actuator for actuating the opening of the current switch; and a trip circuit, linked to the measurement circuit, including means for selecting a trip threshold, and arranged to activate the actuator, said protection unit including a test device such as described above.

The invention also pertains to a method for testing a protection unit including a test device such as described above, the test method including the following steps:

acquiring a measurement of a primary current;

acquiring a value of a selected trip threshold;

determining a minimum current threshold that is associated with the selected trip threshold;

comparing the measurement of the primary current with the minimum current threshold and, if the measurement of the primary current is lower than the minimum threshold;

generating a pulse train that is specific to the selected trip threshold;

acquiring a signal that is representative of the primary current;

identifying a presence of the pulse train or a presence of a DC component in the signal that is representative of the primary current; and transmitting an alert signal to an alert output in the absence of identification of the pulse train in the signal that is representative of the primary current.

BRIEF DESCRIPTION OF THE DRAWINGS

Other advantages and features will become more clearly apparent in the following description of particular embodiments of the invention, which are given by way of non-limiting examples and shown in the appended drawings in which.

DETAILED DESCRIPTION OF PREFERRED EMBODIMENTS

Figure 1:
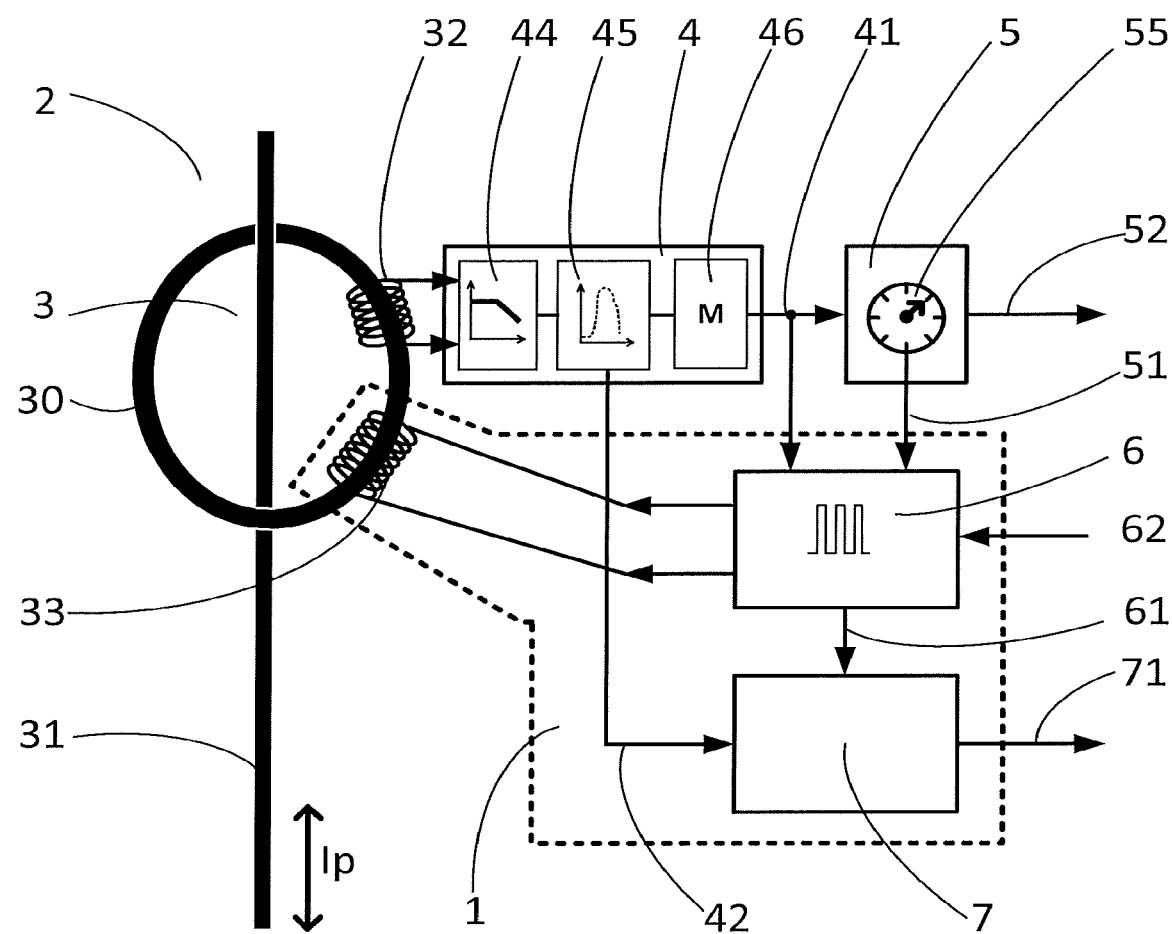
FIG. 1 shows, in the form of a block diagram, a test device of a current measurement chain of an electrical protection unit according to one preferred embodiment of the invention.
Figure 3:
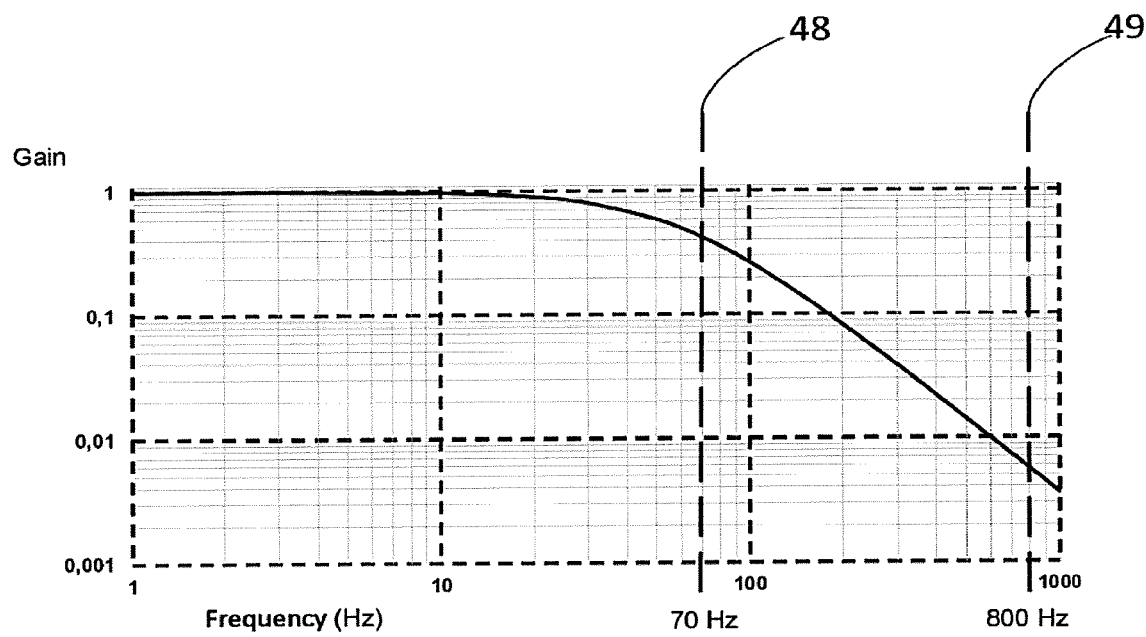
FIG. 3 illustrates a frequency response curve of a low-pass filtering operation performed by a current measurement circuit of an electrical protection unit.

FIG. 1 shows, in the form of a block diagram, a test device 1 of a current measurement chain of an electrical protection unit 2 according to one preferred embodiment of the invention. The protection unit 2 includes a current transformer 3 composed of a magnetic circuit 30 positioned around at least one current conductor 31 through which a primary current Ip flows. The at least one current conductor 31 thus forms a primary circuit of the current transformer 3. There is only one conductor in the case of protection from a short-circuit in a single-phase electrical installation. There are two conductors 31 in the case of differential protection in a single-phase electrical installation, and three or four conductors 31 in the case of differential protection in a three-phase electrical installation with or without a neutral. The number of conductors 31 has no effect on the operation of the invention since the current transformer 3 is sensitive to the vector sum of the currents flowing through the one or more conductors 31. In the presence of more than one current conductor 31, the primary current Ip corresponds to a differential current. The current transformer 3 comprises a first secondary winding 32 wound around the magnetic circuit 30. The primary current Ip generates a magnetic field in the magnetic circuit 30 of the transformer 3 which induces a signal similar to the primary current Ip in the first secondary winding 32. This winding delivers an electrical signal that is proportional to the current Ip, composed of the same frequencies as the current Ip. The proportionality coefficient is equal to the number of turns of the primary conductor 31, generally equal to one, divided by the number of turns of the first secondary winding 32. The main frequency of the current Ip corresponds to the frequency of the electrical network which is generally 50 or 60 Hz. A measurement circuit 4 is connected to the first secondary winding 32. The measurement circuit 4 includes a filter 44 for low-pass filtering the signal delivered by the first secondary winding 32 to remove the high-frequency harmonics contained in the primary current Ip. FIG. 3 illustrates the frequency response curve of the filter 44. The cut-off frequency is preferably comprised between 60 and 120 Hz. Low-pass filtering is also made necessary before sampling the signal delivered by the first secondary winding 32.

The low-pass filter 44 is preferably a second-order filter. The sampling of the signal delivered as output from the filter 44 is performed by the circuit 45, to which it is connected, to deliver a signal 42 that is representative of the primary current. The signal 42 corresponds to the digitization of the signal delivered by the first secondary winding 32 after filtering out the high frequencies. The measurement circuit 4 also carries out a measurement 41 of the primary current Ip, by means of the circuit 46, by using the samples delivered by the circuit 45. The measurement 41 of the primary current Ip is preferably an RMS value of the primary current Ip. Said measurement may also be a peak value or a mean value of the primary current Ip. The measurement 41 of the primary current Ip is delivered to a trip circuit 5. The trip circuit 5 includes means 55 for selecting a trip threshold Sd from among multiple possible thresholds Sd, for example: 5 mA, 30 mA, 100 mA, 1 A, 5 A, 10 A or 100 A, this list being nonlimiting. The selection means 55 may be a button, a switch or else a drop-down menu on a screen, this list being nonlimiting. When the measurement 41 of the primary current is higher than the selected threshold Sd, the trip circuit 5 transmits a trip order 52 to an actuator so as to interrupt the flow of the current Ip.

Figure 4A:
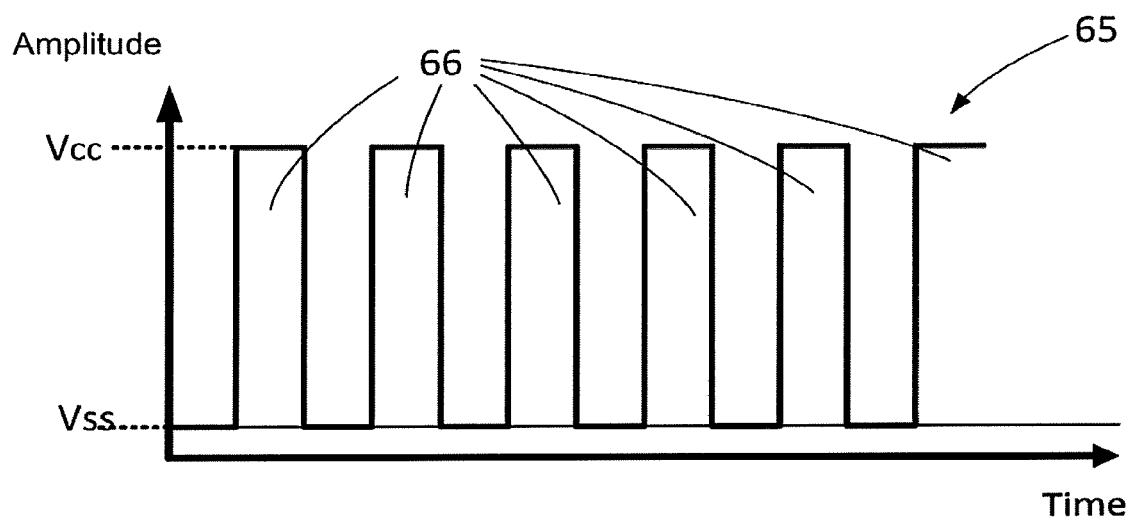
FIGS. 4a and 4b show single-frequency pulse trains generated by the test device according to one preferred embodiment.
Figure 4B:
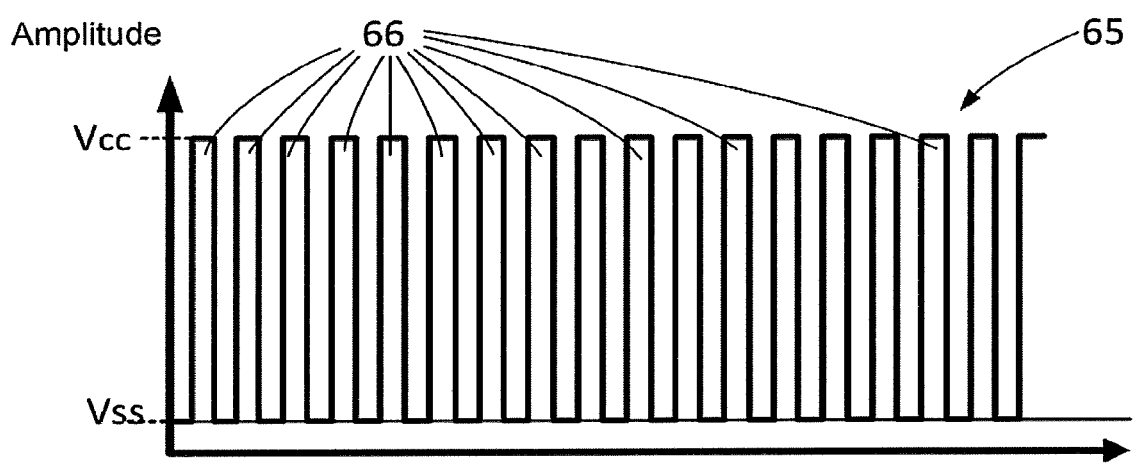
Figure 4C:
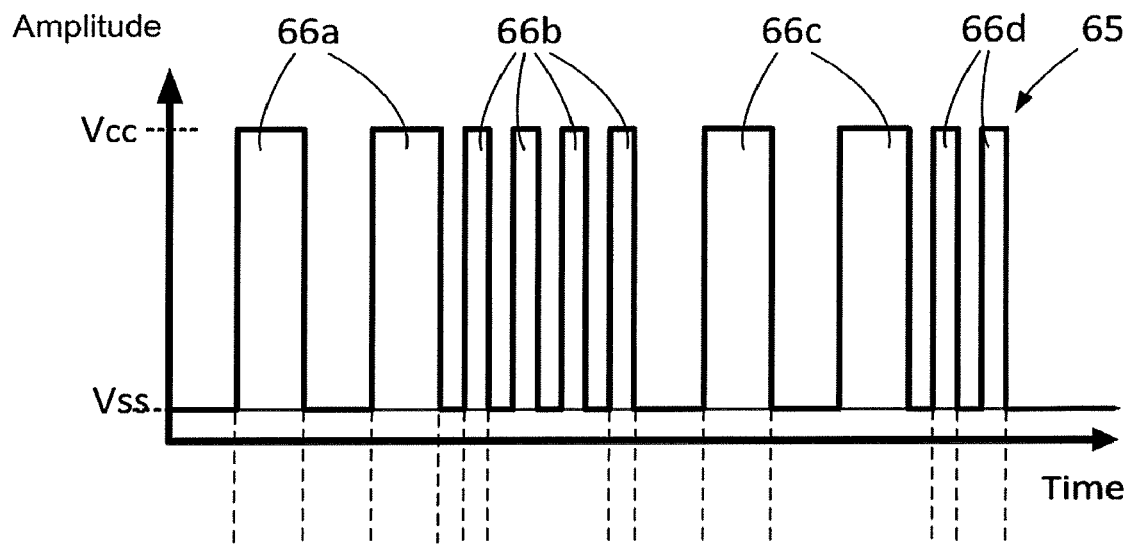
FIG. 4c shows a pulse train including an example of a specific pattern generated by the test device according to one variant embodiment.

The current transformer 3, the measurement circuit 4 and the trip circuit 5 form part of the essential elements of the protection unit. The object of the invention is to check that they are operating correctly by means of a test device. To achieve this, a generator 6 is arranged to generate at least one pulse train 65 in a second secondary winding 33 of the current transformer 3. FIGS. 4A, 4B and 4C show examples of a pulse train 65. A magnetic field is thus produced in the magnetic circuit 30 of the transformer 3 which induces a signal similar to the pulse train 65 in the first secondary winding 32, said signal being superposed on the signal corresponding to the primary current Ip. The measurement circuit 4 thus treats the pulse train 65 in the same way as it treats the signal corresponding to the primary current Ip. Throughout the remainder of the description, it is considered that the signal representative of the primary current 42 includes a signal similar to the primary current Ip on which a signal similar to the pulse train 65 is superposed when it is transmitted. A processing circuit 7 is connected to the measurement circuit 4 to receive the signal representative of the primary current 42 arising from the sampling circuit 45. The processing circuit 7 is also connected to the generator 6 to receive a signal 61 similar to the pulse train 65 transmitted by the generator 6. The processing circuit 7 identifies a presence of the pulse train 65 represented by the signal 61 in the signal representative of the primary current 42. To achieve this, the processing circuit 7 compares the signal representative of the primary current 42 and the signal 61 similar to the pulse train 65. When the processing circuit 7 identifies the presence of the pulse train 65 in the signal representative of the primary current 42, said presence of the pulse train being synchronous with the signal 61 similar to the pulse train 65, then the test result is positive: the current transformer 3, the filter 44 and the sampling circuit 45 are operational.

Figure 2:
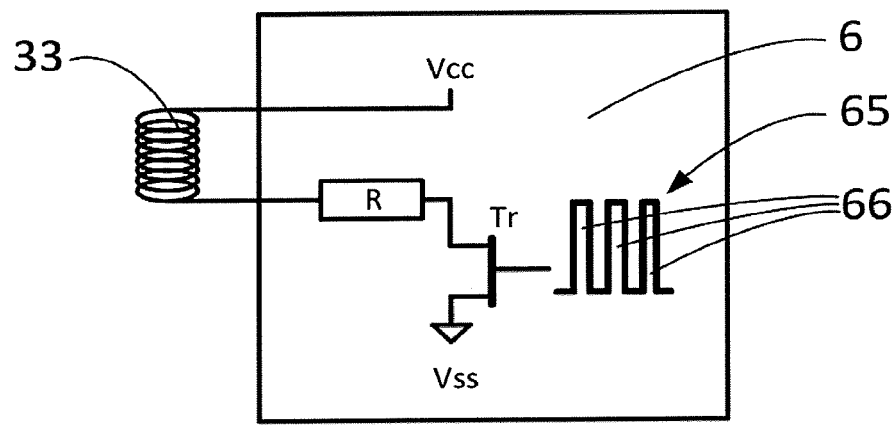
FIG. 2 shows a diagram of a circuit for generating a constant-amplitude pulse train in a secondary winding of a current sensor.

It is important that the test device does not disrupt the operation of the electrical protection unit 2, and more particularly, the operation of the test device must not cause the protection unit 2 to trip. However, it is advantageous to test the operation of the protection unit 2 while retaining the chosen trip threshold Sd. Thus, said threshold is not modified, even temporarily, during the test and all of the thresholds may be tested individually. Lastly, it is economically advantageous for the test device to be simple and inexpensive. To achieve this, the generator 6 transmits a pulse train 65, composed of pulses 66 having a constant amplitude regardless of the chosen trip threshold Sd. FIG. 2 shows a diagram of the circuit for generating the pulse train 65 in the second secondary winding 33. The second secondary winding 33 is connected between a first supply Vcc reference point, corresponding to a DC voltage supply source available in the generator 6, and a second supply Vss reference point, in series with a current-limiting resistor R, making it possible to set the number of ampere-turns for the second secondary winding 33, and a switch Tr. The switch Tr is preferably a transistor to which a pattern corresponding to the pulse train 65 is applied on the control electrode. The switch Tr thus controls the flow of a current through the secondary winding 33 for the duration of each pulse 66 of the pulse train 65. The amplitude of the applied voltage Vcc is constant and independent of the trip threshold Sd. Similarly, the current flowing through the second secondary winding 33, when the switch Tr is closed, is constant and independent of the trip threshold Sd. It should be noted that the pulse train 65, generated in this way, contains a DC component Uc when the supply Vss reference point corresponds to a zero supply voltage. A detection of the DC component may be used in a variant to identify the test signal as will be described below. The amplitude of the pulses and the number of turns of the second secondary winding 33 are sized so as to allow the operation to be tested on the highest trip threshold Sd. In this case, the frequency of the pulses 66 is chosen to be close to the frequency of the electrical network. Preferably, for a trip threshold of 5 A, the frequency of the pulses 66 will be equal to 70 Hz. Such a pulse train is illustrated in FIG. 4A. Preferably, for a trip threshold higher than 1 A, the frequency of the pulses 66 will be lower than 100 Hz. To prevent the pulse train 65 causing the protection unit to trip when the trip threshold Sd is set to a low value, 30 mA for example, the signal measured by the measurement circuit 46 must be lower than the threshold Sd. To achieve this, according to the invention, when the threshold Sd is set to a low value, the frequency of the pulses 66 is increased. Preferably, for a trip threshold equal to 30 mA, the frequency of the pulses 66 will be of the order of 800 Hz. Such a pulse train is illustrated in FIG. 4B. FIG. 3 illustrates the frequency response curve of the filter 44 on which is marked, by means of a vertical reference 48, the frequency of 70 Hz used for the trip threshold Sd equal to 5 A. A vertical reference 49 marks the frequency of 800 Hz used for the trip threshold Sd equal to 30 mA. The filter 44 barely attenuates the frequency of 70 Hz. The pulse train 65 transmitted by the generator through the second secondary winding 33 and received by the first secondary winding 32 will therefore barely be attenuated. However, the filter 44 strongly attenuates the frequency of 800 Hz as indicated by the vertical reference 49. The pulse train 65 transmitted by the generator through the second secondary winding 33 is attenuated so as to remain below the trip threshold Sd and thus not to cause the protection device to trip. The choice of the frequency of the pulses 66, the cut-off frequency of the filter 44, the order of the filter 44, the number of turns and the inductance of the first and second windings make it possible to define the level of signal received by the measurement circuit 46 and hence to define a profile of frequencies such that the measurement of the pulse train 65 after passage through the filter 44 is lower than the trip threshold Sd. More generally, for a high trip threshold Sd, the frequency of the pulses 66 will be low and for a low trip threshold Sd, the frequency of the pulses 66 will be high. The staging of the frequencies in correspondence with the thresholds Sd is such that the frequency of the pulses 66 corresponding to a given trip threshold Sd is higher than the frequency of the pulses corresponding to a higher trip threshold Sd. Thus, the difficulty consisting in testing the current transformer 3 and the measurement circuit 4 by means of a pulse train 65 regardless of the chosen trip threshold Sd is overcome. This solution has the advantage of not requiring a switching of the trip threshold or switching of the load of the first secondary winding 32. The energy required to generate the pulse train 65 is constant, for a given duty cycle, regardless of the frequency of the pulses 66 and regardless of the selected trip threshold Sd. The pulse train 65 may be composed of a predefined number of pulses 66 or else the pulse train 65 may be composed of pulses 66 transmitted over a predefined duration, for example 100 ms, when the trip threshold Sd is equal to 30 mA and 400 ms when the trip threshold Sd is higher than or equal to 100 mA. The test device preferably transmits a pulse train 66 when a test request 62 is activated, preferably by means of a pushbutton that can be accessed by an operator, or by means of a communication bus. As a variant, a test request may be activated by the generator 6, cyclically and automatically, for example once per hour or once per day. Preferably, a minimum interval of two seconds is required between two consecutive pulse trains 65.

The generator 6 is linked to the trip circuit 5 by a link 51 so as to acquire the value of the selected trip threshold Sd.

Thus, the generator 6 may generate the specific pulse train 65 corresponding to the selected trip threshold Sd.

An electrical protection unit may be installed on a network including one or more electronic loads such as a variable speed drive, or a voltage or frequency converter. Such loads generate harmonics on the network which may be interpreted by the processing circuit 7 as being representative of the frequency of the pulses 66 transmitted by the generator 6. As a variant, the generator may transmit a pulse train including a particular pattern, which can be recognized by the processing circuit 7. An infinite number of different patterns may be defined. Simple patterns are illustrated in FIG. 4A and FIG. 4B. An example of a more complex pattern is illustrated in FIG. 4C. It includes one or more pulses 66a and 66c having a given frequency followed by one or more pulses 66b and 66d having a different frequency. A pattern may include a variable number of pulses, but the number of pulses forms part of the definition of the pattern: if the generator 6 transmits a pulse train 65 composed of 10 pulses 66 having a frequency of 800 Hz and the processing circuit identifies 20 pulses having a frequency of 800 Hz, the result of the test must be considered to be negative since a source of interference at 800 Hz is evidently present. A specific pattern makes it possible to identify, without error, the presence of the pulse train 65 contained in the signal received by the first secondary winding 32, even if said signal contains a large number of parasitic harmonics. The expression "identify a presence of the pulse train 65 in the signal representative of the primary current 42" is understood to mean a recognition of the specific pattern corresponding to the selected trip threshold Sd, for example such as shown in FIG. 4C, for a trip threshold Sd that is equal to 100 mA, a series of two pulses 66a having a frequency of 400 Hz, followed by four pulses 66b having a frequency of 800 Hz, followed by two pulses 66c having a frequency of 400 Hz and lastly two pulses 66d having a frequency of 800 Hz.

Figure 5:
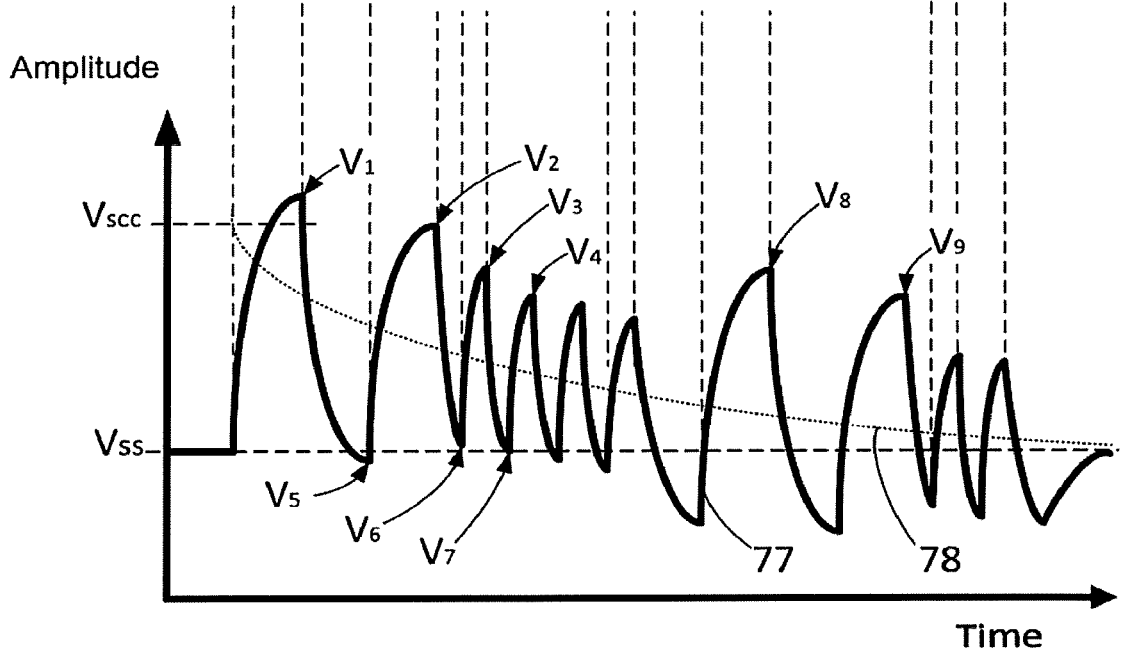
FIG. 5 shows the variation in the result of a calculation of an RMS value of a measurement signal during an application of a test signal shown in FIG. 4c.

The processing circuit 7 preferably identifies the pulse train 65 present on the signal representative of the primary current 42 by means of a point-by-point comparison between the pulse train 65 transmitted by the generator 6, for example such as shown in FIG. 4C, and the corresponding signal representative of the primary current 42 such as shown in FIG. 5. Following the transmission of the first test pulse 66a, a rising edge appears, reaching a maximum V1, on the signal representative of the primary current 42. Next, when the first pulse 66a drops down to zero, a falling edge reaching a minimum V5 is present on the signal representative of the primary current 42. The same applies for the following pulses. Thus, the detection of a rising edge or of a falling edge on the signal representative of the primary current 42 in synchronism with the transmission of a test pulse 66 is proof that the pulses present on the signal 42 come from the generator 6 and not from a parasitic source outside the device.

An additional means of identifying the pulse train 65 present on the signal representative of the primary current 42 may be obtained by comparing the amplitude of the pulses present on the signal representative of the primary current 42 according to the frequency of these same pulses. Thus, the pulses 66a having a frequency of 400 Hz will be less attenuated by the filter 44 than the pulses 66b having a frequency of 800 Hz. On the signal representative of the primary current 42 illustrated in FIG. 5, the amplitudes $V_1$-$V_5$ and $V_2$-$V_6$ corresponding to the pulses 66a having a frequency of 400 Hz are larger than the amplitudes $V_3$-$V_7$ and $V_4$-$V_7$ corresponding to the pulses 66b having a frequency of 800 Hz. The difference in amplitude is defined by the attenuation of the filter 44 at the frequencies of 400 Hz and 800 Hz.

Another possibility for identifying the presence of the pulse train 65 in the signal representative of the primary current 42 is to carry out a spectral decomposition such as a Fourier transform so as to identify the various respective frequencies and amplitudes contained in signal 42. Other means may be used such as convolution or else correlation of the signals 42 and 61. The calculations required for identification are performed, for example, by means of a microcontroller of the processing circuit 7.

One additional possibility for promoting the identification of the pulse train 65 present on the signal representative of the primary current 42 may be obtained by using a pattern composed of pulses 66 having a duty cycle other than 50%. For example, a pulse may have an amplitude Vcc for 60% of the period and a zero amplitude for the remaining 40% of the time.

As a variant, the processing circuit 7 possesses a module for detecting the presence of the DC component Uc present in the test signal, independently of or in addition to the detection of the frequency of the pulses 66 or of the pattern contained in the pulse train 65. By principle, the current transformer 3 does not transform the DC current and behaves as a high-pass filter. However, an edge of a DC current pulse will be transmitted through the windings of the transformer. This property is used to detect the presence of the DC component Uc present in the test signal. When the first pulse 66a is transmitted by the magnetic circuit 30 of the transformer 3, the signal representative of the primary current 42 includes a rising edge having a starting potential Vss and a maximum amplitude V1. Since the magnetic circuit filters out any DC component, the amplitude of the pulses on the signal representative of the primary current 42 will gradually be centred on the potential Vss and the amplitude V2, V8, V9 of the following pulses passes below the threshold Vscc. The decrease follows an approximately exponential decrease, illustrated by the curve 78 in FIG. 5, which is characteristic of the presence of a DC component. This decrease may be used to identify the transmission of a pulse train 65. A threshold Vscc is predetermined at a value that is lower than V1 and higher than one of the maxima V2, V3 or V4. A module of the processing circuit 7 identifies the presence of the DC component in the signal representative of the primary current 42 by detecting a crossing of the threshold Vscc by the signal representative of the primary current 42. Said crossing is characteristic of the presence of a DC component linked to the transmission of a pulse train 65 by the generator 6 and hence verifies that the current measurement chain of the electrical protection unit 2 is operating correctly.

The processing circuit 7 of the test device 1 has an output for transmitting an alert signal 71 in the absence of identification of the pulse train 65 or in the absence of detection of the DC component Uc in the signal representative of the primary current 42 when the generator 6 generates a pulse train 65 in the second secondary winding 33. The alert signal 71 allows the user to be informed of an operating fault without causing the electrical protection unit 2 to trip. In this way, continuity of service is ensured and the user will be able to program a maintenance operation on the faulty hardware at a convenient time.

The functions of the generator 6 and of the processing circuit 7 are preferably performed by means of computer programs run by one or more microprocessors. For power dissipation reasons, the transistor Tr of the generator 6 may be a component connected on the outside of the microprocessor. The generator 6 and the processing circuit 7 may also be incorporated within a digital or analogue device incorporating other functions. Preferably, the generator 6 and the processing circuit 7 form part of an assembly that is separate from the unit containing the measurement circuit 4 and the trip circuit 5 so as to provide improved operational safety. Indirectly, the test device 1 makes it possible to check whether the measurement 4 and trip 5 circuits are being supplied with power correctly. As a variant, the filter 44 may be placed, either entirely or partly, between the output of the generator 6 and the second secondary winding 33. This variant will be used when the filter 44 does not have the characteristics required for a frequency response such as shown in FIG. 3. It will thus be possible to correct the frequency response of the detection and test chain composed of the generator 6, the current transformer 3 and the measurement circuit 4.

Figure 6:
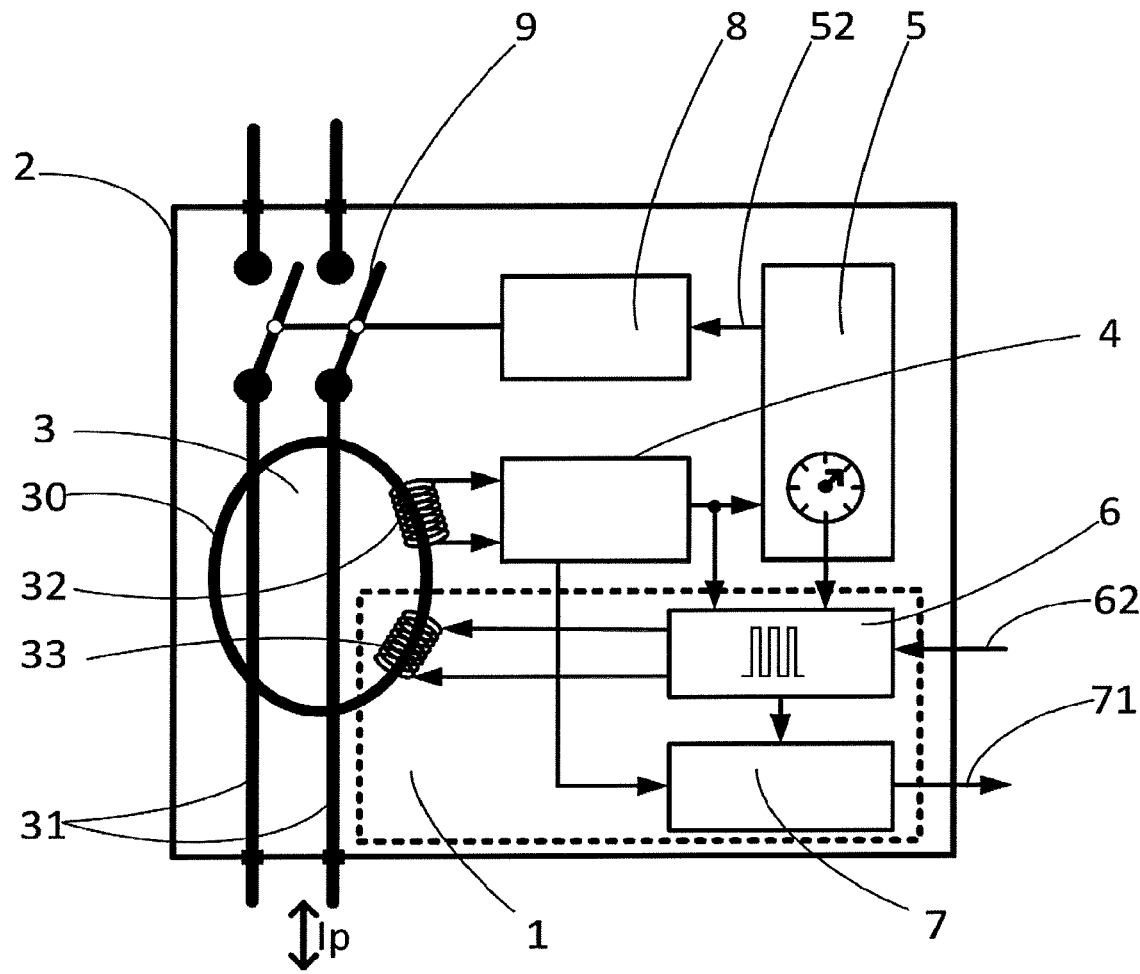
FIG. 6 schematically shows a protection unit including the test device of the invention.

The invention also pertains to a protection unit 2 of an electrical network including a test device 1 such as described above. Said protection unit 2, shown schematically in FIG. 6, includes a current transformer 3 delivering a signal representative of a current Ip flowing through two current conductors 31. The current transformer 3 thus described is a differential current sensor, delivering a signal representative of a difference in current flowing through the conductors 31, said signal being delivered to a measurement circuit 4 and to a trip circuit 5 such as are described above. When the measurement 41 of the primary current Ip is higher than the trip threshold Sd, the trip circuit 5, linked to an actuator 8, sends a trip signal 52 to the actuator 8 so as to activate said actuator. The actuator 8 is a trip member arranged to actuate the opening of a current switch 9 so as to interrupt the flow of the current Ip through the conductors 31.

The protection unit 2 is provided with a test device such as described above: a generator 6 transmits a pulse train 65 through a secondary winding 33 of the current transformer 3 and detects and identifies, by means of a processing circuit 7, the presence of the pulse train in a signal representative of the primary current 42. An alert signal 71 is transmitted in the absence of identification of the pulse train 65 or in the absence of detection of the DC component Uc in the signal representative of the primary current 42 when the generator 6 generates a pulse train 65 in the second secondary winding 33. The alert signal 71 could be used, according to the needs of the user, to transmit an alert message to a supervisor or to actuate a signalling or trip member.

Figure 7:
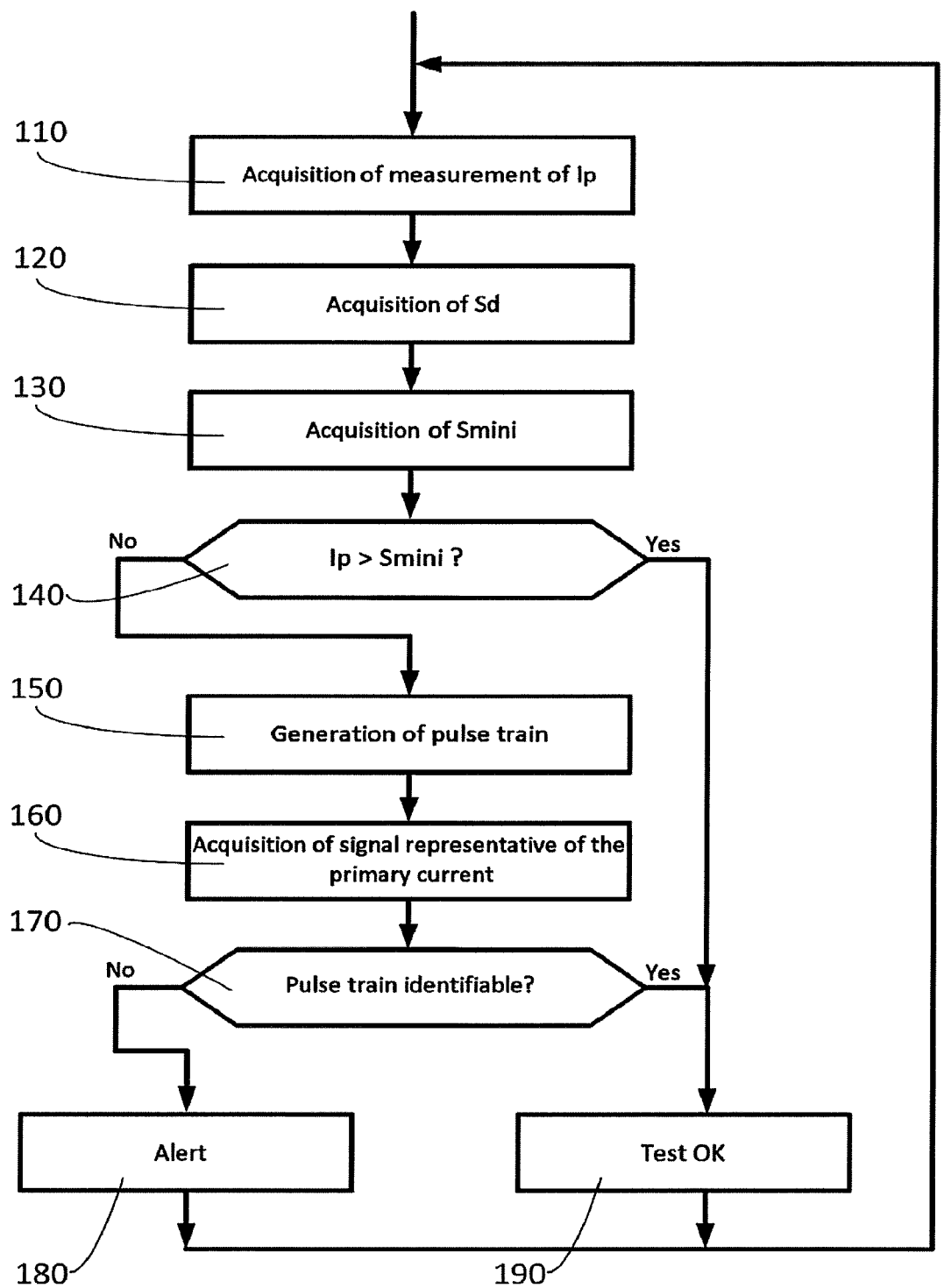
FIG. 7 shows a flowchart of a method for testing a protection unit including a test device according to the invention.

The test device 1 may periodically or continuously transmit one or more test pulse trains 65. The pulse train 65 is added to the signal generated by the primary current Ip through the first secondary winding 32. If the signal generated by the primary current Ip is slightly lower than the trip threshold Sd, the addition of the additional signal generated by the pulse train 65 may cause the measurement 41 of the primary current to pass above the selected threshold Sd and hence cause a trip order 52. To prevent such an unwanted trip, the invention also includes a method for testing a protection unit including a test device such as described above. A flowchart of the test method is shown in FIG. 7. The method includes a step 110 of acquiring a measurement 41 of the primary current Ip; next, in a step 120, the method includes a step of acquiring a selected trip threshold Sd value. The method then includes a step 130 in which a minimum current threshold Smini is determined. The minimum current threshold Smini is predetermined and associated with each of the trip thresholds Sd.

By way of example:
for a trip threshold Sd equal to 30 mA, the minimum threshold Smini is equal to 6 mA,
for a threshold Sd equal to 100 mA, Smini is equal to 12 mA;
for a threshold Sd equal to 1 A, Smini is equal to 50 mA.

The threshold Smini may also be defined as a fraction of the trip threshold Sd, for example Smini=15%× Sd. The method next includes a step 140 of comparing the measurement of the primary current 41 with the minimum current threshold Smini. If the measurement of the primary current 41 is higher than Smini, this means that a primary current Ip, having an amplitude that is at least equal to Smini, is flowing through the primary conductor 31. Such information is, in itself, what is meant by the correct operation of the current transformer 3, of the measurement circuit 4 and of the trip circuit 5. It is therefore not necessary to test the operation, thereby avoiding an unwanted trip, such as described above, when the primary current Ip is slightly lower than the trip threshold Sd. The method then moves on to a step 190 corresponding to a positive test result which may be marked by the activation of signalling on the test device 1.

If, during the test in step 140, the measurement of the primary current 41 is lower than the minimum current threshold Smini, this means that a weak primary current Ip, having an amplitude lower than Smini, is flowing through the primary conductor 31, or that the primary current Ip is zero or else that the current transformer 3 or the measurement circuit 4 is faulty. In this case, the method moves on to a step 150 in which at least one pulse train 65 of pulses that are specific to the selected trip threshold Sd is generated. Next, in step 160, a signal representative of the primary current 42 is acquired. Then, in step 170, a presence of the pulse train 65 in the signal representative of the primary current 42 is identified by one or more methods described above. If the identification or detection of the DC component is negative, then the method moves on to step 180 in which an alert signal 71 is generated. Otherwise, the result of the test is positive. Upon completion of steps 180 and 190, the method returns to step 110 for a new test cycle.

The test method is carried out jointly by the generator 6 and the processing circuit 7. Such a test method makes it possible to test whether all or part of a processing chain for the signal of a protection unit is operating correctly regardless of the selected trip threshold, without causing an unwanted opening of the electrical circuit.

The invention claimed is:
1. A device for testing the operation of a protection unit of an electrical network, said protection unit comprising:
a current transformer composed of a magnetic circuit positioned around at least one current conductor through which a primary current flows forming a primary circuit, said transformer comprising a first secondary winding wound around the magnetic circuit;
a measurement circuit, connected to the first secondary winding, including a second-order low-pass filter, and configured to filter and to deliver, after filtering, a signal that is representative of the primary current and to deliver a measurement of the primary current; and
a trip circuit, linked to the measurement circuit, the trip circuit including a selectable trip threshold,
wherein said test device comprises:
a second secondary winding wound around the magnetic circuit;
a generator, linked to the trip circuit to acquire a selected trip threshold, configured to generate a pulse train in the second secondary winding according to a profile of frequencies such that measurement of the pulse train after passage through the low-pass filter is lower than the selected trip threshold; and a processing circuit, connected to the measurement circuit and to the generator, configured to identify a presence of the pulse train in the signal that is representative of the primary current.

2. The test device according to claim 1, wherein the pulse train generated in the second secondary winding includes constant-amplitude pulses.

3. The test device according to claim 1, wherein the processing circuit transmits an alert signal in the absence of identification of the pulse train in the signal that is representative of the primary current when the generator generates a pulse train in the second secondary winding.

4. A protection unit of an electrical network comprising:
a current transformer composed of a magnetic circuit positioned around at least one current conductor through which a primary current flows forming a primary circuit, said current transformer comprising a first secondary winding wound around the magnetic circuit;
a measurement circuit, connected to the first secondary winding, including a low-pass filter, and configured to filter and to deliver, after filtering, a signal that is representative of the primary current and to deliver a measurement of the primary current;
a current switch configured to establish or interrupt a flow of an electric current in the at least one current conductor;
an actuator configured to actuate an opening of the current switch; and
a trip circuit, linked to the measurement circuit, and having a selectable trip threshold, the trip circuit being configured to activate the actuator,
wherein said protection unit includes a test device according to claim 1.

5. A method for testing a protection unit including a test device according to claim 1, comprises:
acquiring a measurement of a primary current;
acquiring a value of a selected trip threshold;
determining a minimum current threshold that is associated with the selected trip threshold;
comparing the measurement of the primary current with the minimum current threshold and, if the measurement of the primary current is lower than the minimum threshold;
generating a pulse train that is specific to the selected trip threshold;
acquiring a signal that is representative of the primary current;
identifying a presence of the pulse train or a presence of a DC component in the signal that is representative of the primary current; and
transmitting an alert signal to an alert output in the absence of identification of the pulse train in the signal that is representative of the primary current.

6. The test device according to claim 1, wherein the pulse train is composed of pulses having a specific frequency for each selected trip threshold.

7. The test device according to claim 6, wherein the frequency of the pulses corresponding to a given trip threshold is higher than the frequency of the pulses corresponding to a higher trip threshold.

8. The test device according to claim 7, wherein the frequency of the pulses is higher than 300 Hz for a trip threshold that is equal to 30 mA.

9. The test device according to claim 8, wherein the frequency of the pulses is lower than 100 Hz for a trip threshold that is higher than 1 A.

10. The test device according to claim 1, wherein the pulse train includes a series of pulses having a frequency and duty cycle to form a pattern that can be identified by the processing circuit.

11. The test device according to claim 10, wherein the pattern that can be identified by the processing circuit is specific for each selected trip threshold.

12. The test device according to claim 1, wherein the pulses include a DC component.

13. The test device according to claim 12, wherein the processing circuit is further configured to identify a presence of the DC component in the signal that is representative of the primary current.

* * * * *